United States Patent
Kwon et al.

(10) Patent No.: US 11,678,501 B2
(45) Date of Patent: Jun. 13, 2023

(54) DISPLAY DEVICE AND METHOD OF MANUFACTURING THE SAME

(71) Applicant: Samsung Display Co., Ltd., Yongin-si (KR)

(72) Inventors: Ohjune Kwon, Hwaseong-si (KR); Seungyong Song, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/566,485

(22) Filed: Dec. 30, 2021

(65) Prior Publication Data

US 2022/0123254 A1 Apr. 21, 2022

Related U.S. Application Data

(62) Division of application No. 16/405,402, filed on May 7, 2019, now Pat. No. 11,245,088.

(30) Foreign Application Priority Data

May 31, 2018 (KR) .................. 10-2018-0062265

(51) Int. Cl.
*H01L 51/52* (2006.01)
*H01L 51/56* (2006.01)
*H01L 51/00* (2006.01)

(52) U.S. Cl.
CPC ...... *H01L 51/5237* (2013.01); *H01L 51/0097* (2013.01); *H01L 51/56* (2013.01)

(58) Field of Classification Search
CPC .................................................. H01L 51/0097
See application file for complete search history.

(56) References Cited

U.S. PATENT DOCUMENTS

| | | |
|---|---|---|
| 8,174,822 B2 | 5/2012 | Kim et al. |
| 9,099,662 B2 | 8/2015 | Choi et al. |
| 9,419,065 B2 | 8/2016 | Degner et al. |
| 9,516,743 B2 | 12/2016 | Kim et al. |
| 9,530,831 B2 | 12/2016 | Lee et al. |

(Continued)

FOREIGN PATENT DOCUMENTS

| | | |
|---|---|---|
| CN | 101174373 A | 5/2008 |
| CN | 104071989 A | 10/2014 |

(Continued)

OTHER PUBLICATIONS

Office Action dated Jun. 6, 2022, for corresponding Chinese Patent Application No. 201910432256.2 (11 pages).

*Primary Examiner* — Ian A Rummel
(74) *Attorney, Agent, or Firm* — Lewis Roca Rothgerber Christie LLP

(57) ABSTRACT

A display device includes a display panel, a protective film, and an adhesive member. The display panel includes a non-bending area and a bending area configured to bend from the non-bending area, and the bending area includes a curvature area with a curvature and a facing area facing the non-bending area. The protective film is on a rear surface of the display panel, and includes a first surface facing the rear surface of the display panel and a second surface opposite to the first surface. The protective film has a groove corresponding to the curvature area. The adhesive member is between the protective film and the display panel, and a hydrophobic layer is on the second surface of the protective film, and is adjacent to the groove.

7 Claims, 12 Drawing Sheets

(56) References Cited

U.S. PATENT DOCUMENTS

| | | |
|---|---|---|
| 9,614,168 B2 | 4/2017 | Zhang et al. |
| 9,793,512 B2 | 10/2017 | Choi et al. |
| 10,056,568 B2 | 8/2018 | Min et al. |
| 10,269,280 B2 | 4/2019 | Oh |
| 2009/0246394 A1 | 10/2009 | Hanson et al. |
| 2013/0081756 A1 | 4/2013 | Franklin et al. |
| 2014/0140015 A1 | 5/2014 | Choi et al. |
| 2017/0042047 A1 | 2/2017 | Oh |
| 2017/0263887 A1 | 9/2017 | Han et al. |
| 2017/0294609 A1 | 10/2017 | Namkung |
| 2018/0081399 A1 | 3/2018 | Kwon et al. |

FOREIGN PATENT DOCUMENTS

| | | |
|---|---|---|
| CN | 106450024 A | 2/2017 |
| CN | 107180595 A | 9/2017 |
| CN | 107221606 A | 9/2017 |
| CN | 107492556 A | 12/2017 |
| JP | 2001-117119 A | 4/2001 |
| JP | 4803424 B2 | 8/2011 |
| KR | 20140065660 | 5/2014 |
| KR | 10-2014-0070854 A | 6/2014 |
| KR | 10-2014-0085956 A | 7/2014 |
| KR | 10-2017-0116303 A | 10/2017 |
| KR | 20170140489 | 12/2017 |
| KR | 10-1844432 B1 | 4/2018 |

DISPLAY DEVICE AND METHOD OF MANUFACTURING THE SAME

CROSS-REFERENCE TO RELATED APPLICATIONS

This application is a divisional of U.S. patent application Ser. No. 16/405,402, filed May 7, 2019, now U.S. Pat. No. 11,245,088, which claims priority to and the benefit of Korean Patent Application No. 10-2018-0062265, filed May 31, 2018, the entire content of both of which is incorporated herein by reference.

BACKGROUND

1. Field

The present disclosure relates to a display device and a method of manufacturing the same. More particularly, the present disclosure relates to a display device having improved bending characteristic and a method of manufacturing the display device.

2. Description of the Related Art

Electronic devices, such as a smartphone, a tablet computer, a notebook computer, and a smart television, have been developed. The electronic devices include display devices to provide information. The electronic devices further include a variety of electronic modules in addition to the display devices.

The display device included in the electronic device may be partially bent to implement a slim bezel.

SUMMARY

This summary is provided to introduce a selection of features and concepts of embodiments of the present disclosure that are further described below in the detailed description. This summary is not intended to identify key or essential features of the claimed subject matter, nor is it intended to be used in limiting the scope of the claimed subject matter. One or more of the described features may be combined with one or more other described features to provide a workable device.

Some example embodiments of the present disclosure provide a display device having improved bending characteristic.

Some example embodiments of the present disclosure provide a method of manufacturing the display device.

Some example embodiments of the inventive concept provide a display device including a display panel, a protective film, and an adhesive member.

In some example embodiments, a display panel includes a non-bending area and a bending area bent from the non-bending area, and the bending area includes a curvature area with a set or predetermined curvature and a facing area facing the non-bending area. The protective film is on a rear surface of the display panel, and includes a first surface facing the rear surface of the display panel and a second surface opposite to the first surface, and is provided with a groove defined therein corresponding to the curvature area. The adhesive member is between the protective film and the display panel, and a hydrophobic layer is on the second surface of the protective film to be adjacent to the groove.

In some example embodiments, the second surface of the protective film is divided into a first rear surface and a second rear surface such that the groove is disposed between the first and second rear surfaces, and the protective film further includes a first inner side surface extending from the first rear surface to define the groove and a second inner side surface extending from the second rear surface to define the groove.

In some example embodiments, the hydrophobic layer includes a first hydrophobic layer on the first rear surface to be adjacent to the first inner side surface and a second hydrophobic layer on the second rear surface to be adjacent to the second inner side surface.

In some example embodiments, the groove extends in a first direction, and each of the first and second hydrophobic layers extends along the first direction.

In some example embodiments, the first hydrophobic layer and the second hydrophobic layer face each other.

In some example embodiments, the hydrophobic layer includes one of manganese oxide (MnO2) polystyrene, zinc oxide (ZnO) polystyrene, precipitated calcium carbonate, carbon nanotube, silica, and fluoropolymer.

Some example embodiments of the inventive concept provide a method of manufacturing a display device including a preliminary display device including a display panel including a first area and a second area connected to the first area, an adhesive member on a rear surface of the display panel, and a preliminary protective film including a first surface on which a rear surface of the adhesive member is disposed, forming a preliminary hydrophobic layer on a second surface of the preliminary protective film, which faces the first surface of the protective film, to correspond to the second area, pressing the protective film and the preliminary hydrophobic layer using a heating block such that a portion of the protective film corresponding to a portion of the second area is removed to form a groove and to divide the preliminary hydrophobic layer into first and second hydrophobic layers by the groove, the removed portion of the protective film being formed as first and second bumps on an upper surface of the first and second hydrophobic layers, respectively, removing the first and second bumps formed on the upper surface of the first and second hydrophobic layers, and bending the second area.

In some example embodiments, the first and second bumps are removed by using an air spray device spraying air.

In some example embodiments, the first hydrophobic layer and the second hydrophobic layer face each other when the second area is bent.

Some example embodiments of the inventive concept provide a method of manufacturing a display device including a preliminary display device including a display panel including a first area and a second area connected to the first area, an adhesive member on a rear surface of the display panel, and a protective film including a first surface on which a rear surface of the adhesive member is disposed, forming first and second sub-grooves in a second surface of the protective film, which faces the first surface of the protective film, to overlap with the second area, pressing the protective film using a heating block such that a portion of the protective film corresponding to a portion between the first and second sub-grooves is removed to form a groove, the removed portion of the protective film, which is collected in the first and second sub-grooves being formed as first and second bumps, and bending the second area.

In some example embodiments, the second surface of the protective film is divided into a first rear surface and a second rear surface such that the groove is disposed between the first and second rear surfaces, and the protective film further includes a first inner side surface extending from the first rear surface to define the groove and a second inner side surface extending from the second rear surface to define the groove.

In some example embodiments, the first sub-groove is formed between the first rear surface and the first inner side surface, and the second sub-groove is formed between the second rear surface and the second inner side surface.

In some example embodiments, the groove extends in a first direction, and each of the first and second sub-grooves extends in the first direction along the groove.

In some example embodiments, the first and second sub-grooves are formed in the second surface through a blanking process.

In some example embodiments, the first bump and the second bump face each other when the second area is bent.

In some example embodiments, the display device may reduce the interference due to the bumps around the curvature area of the display panel.

According to some example embodiments of the manufacturing method of the display device, because the bumps are removed or the size of the bumps is reduced during the bending process, a design margin of the display device may be secured.

BRIEF DESCRIPTION OF THE DRAWINGS

The above and other features of the present disclosure will become readily apparent by reference to the following detailed description when considered in conjunction with the accompanying drawings wherein.

DETAILED DESCRIPTION

Figure 1:
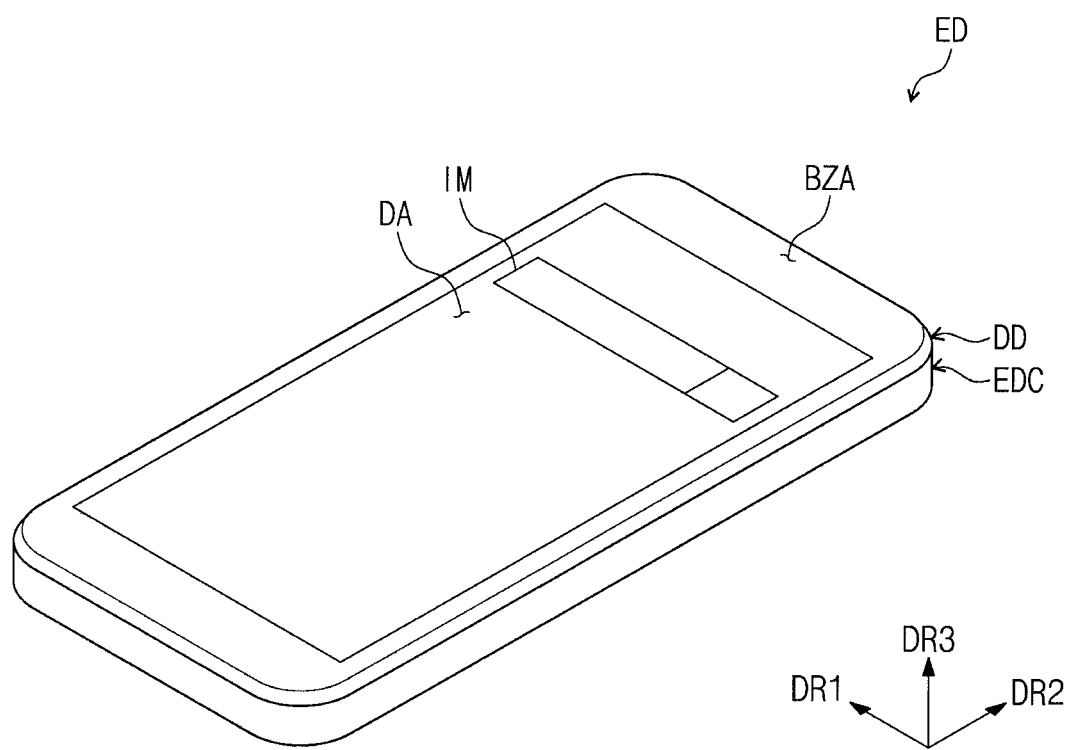
FIG. 1 is a perspective view showing an electronic device, according to an exemplary embodiment of the present disclosure.

The present disclosure may be variously modified and realized in many different forms, and thus specific embodiments will be exemplified in the drawings and described in detail hereinbelow. However, the present disclosure may not be limited to the specific disclosed forms, and be construed to include all modifications, equivalents, or replacements included in the spirit and scope of the present invention.

It will be understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof. In addition, It will be understood that when a layer, film, area, or plate is referred to as being "on" another layer, film area, or plate, it can be directly on the other layer, film, area, or plate or intervening layers, films, areas, or plates may be present. In contrast, when a layer, film, area, or plate is referred to as being "below" another layer, film area, or plate, it can be directly below the other layer, film, area, or plate or intervening layers, films, areas, or plates may be present.

Like numbers refer to like elements throughout. In the drawings, structures are exaggerated for clarity. It will be understood that, although the terms first, second, etc. may be used herein to describe various elements, components, regions, layers and/or sections, these elements, components, regions, layers and/or sections may not be limited by these terms. These terms are only used to distinguish one element, component, region, layer or section from another region, layer or section. Thus, a first element, component, region, layer or section discussed below could be termed a second element, component, region, layer or section without departing from the teachings of the present invention. As used herein, the singular forms, "a", "an" and "the" are intended to include the plural forms as well, unless the context clearly indicates otherwise.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed herein could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art.

As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the present invention". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Although exemplary embodiments of a display device and a method of manufacturing the same have been specifically described and illustrated herein, many modifications and variations will be apparent to those skilled in the art. Accordingly, it is to be understood that a display device and a method of manufacturing the same constructed according to principles of this invention may be embodied other than as specifically described herein. The invention is also defined in the following claims, and equivalents thereof.

Hereinafter, the present invention will be explained in detail with reference to the accompanying drawings.

FIG. 1 is a perspective view showing an electronic device ED, according to an exemplary embodiment of the present disclosure.

Referring to FIG. 1, a smartphone is shown as a representative example of the electronic device ED, but the electronic device ED may not be limited to the smartphone. In the exemplary embodiment of the present disclosure, the electronic device ED may be a tablet computer, a notebook computer, or a smart television.

As shown in FIG. 1, a display surface, through which an image IM is displayed, is substantially parallel to a surface defined by a first direction axis DR1 and a second direction axis DR2. The display surface may include a display area DA and a bezel area BZA adjacent to the display area DA. FIG. 1 shows an internet search window as a representative example of the image IM. As an example, the display area DA may have a quadrangular shape. The bezel area BZA may surround the display area DA. In other words, the bezel area BZA serves as an edge of the display surface.

A third direction axis DR3 indicates a normal line direction of the display surface, i.e., a thickness direction of the electronic device ED. Front (or upper or first) and rear (or lower or second) surfaces of each member are distinguished from each other with respect to the direction in which the image IM is displayed. However, directions indicated by the first, second, and third direction axes DR1, DR2, and DR3 are relative to each other, and thus the directions indicated by the first, second, and third direction axes DR1, DR2, and DR3 may be changed to other directions. Hereinafter, first, second, and third directions, which are respectively indicated by the first, second, and third direction axes DR1, DR2, and DR3, will be assigned with the same reference numerals as those of the first, second, and third direction axes DR1, DR2, and DR3.

The electronic device ED may include a display device DD and an external case EDC. The display device DD will be described in detail later.

The external case EDC may be coupled to the display device DD. The external case EDC may provide an external surface of the electronic device ED. In the exemplary embodiment, the external case integrally formed as a single unitary and individual unit (i.e., a single body) is shown as a representative example. However, in some embodiments, the external case EDC may include a plurality of bodies assembled to each other. The external case EDC may include a plurality of frames and/or plates formed of a glass, plastic, and/or metal material.

Figure 2:
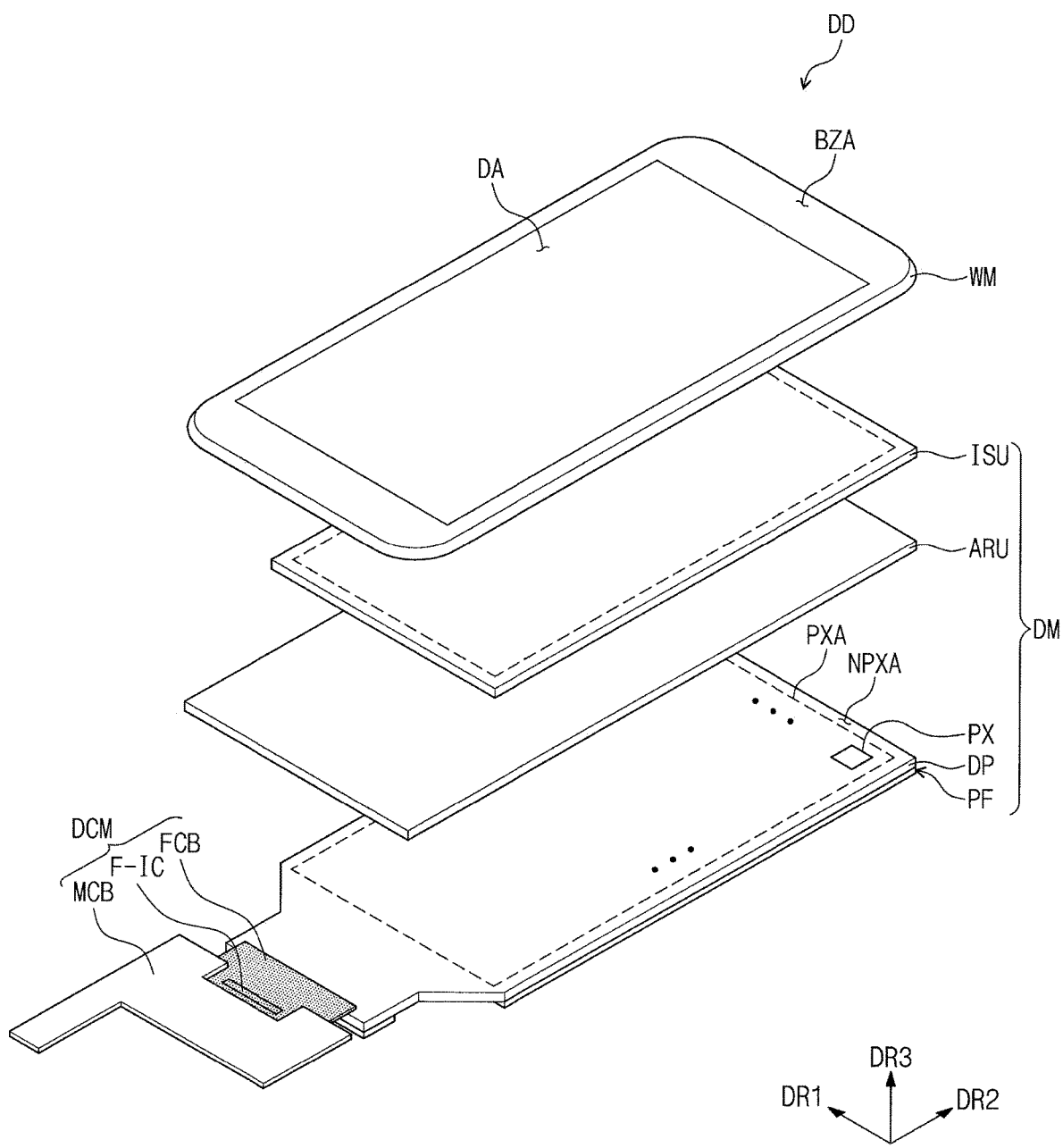
FIG. 2 is an exploded perspective view showing a display device, according to an exemplary embodiment of the present disclosure.
Figure 3:
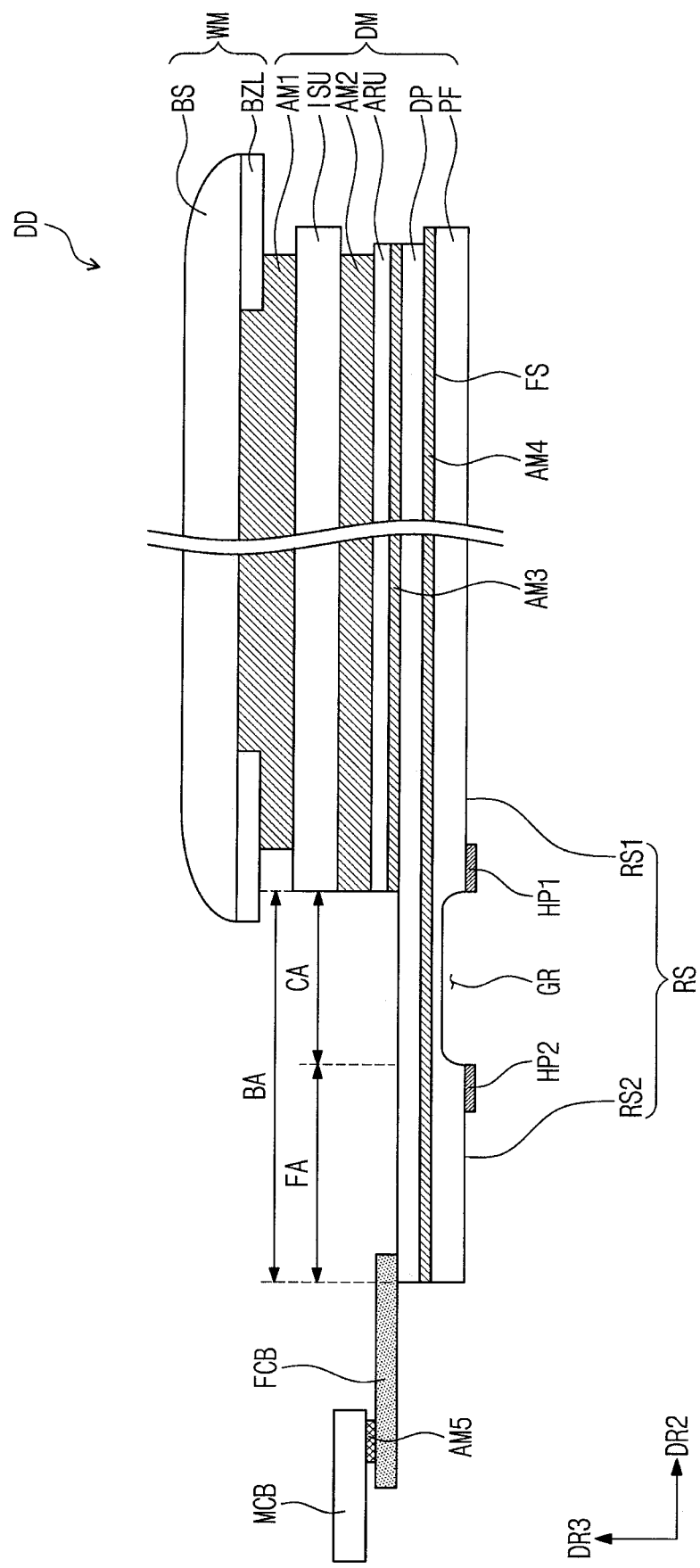
FIG. 3 is a side view showing the display device of FIG. 2, according to an exemplary embodiment of the present disclosure.
Figure 4:
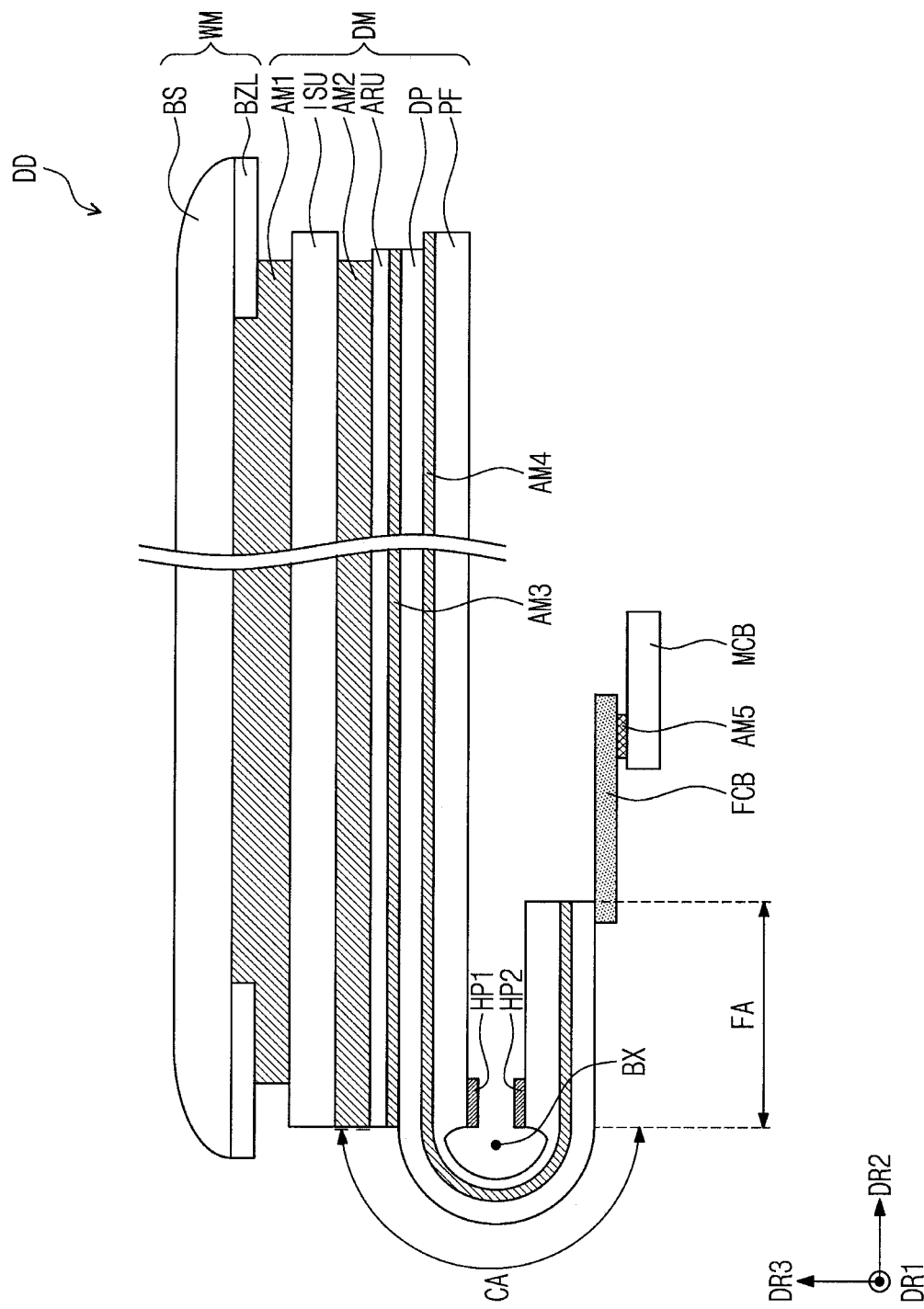
FIG. 4 is a side view showing a bent state of the display device shown in FIG. 3, according to an exemplary embodiment of the present disclosure.

FIG. 2 is an exploded perspective view showing a display device DD, according to an exemplary embodiment of the present disclosure, FIG. 3 is a side view showing the display device DD of FIG. 2, according to an exemplary embodiment of the present disclosure, and FIG. 4 is a side view showing a bent state of the display device DD shown in FIG. 3, according to an exemplary embodiment of the present disclosure.

As shown in FIG. 2, the display device DD may include a window member WM and a display module DM. The window member WM includes a base member BS (as shown in FIG. 3) and a bezel layer BZL (as shown in FIG. 3) on a rear surface of the base member BS. An area in which the bezel layer BZL is disposed may be referred to as the bezel area BZA as shown in FIG. 1. In the present embodiment, the window member WM has a flat shape in the display area DA, however, the shape of the window member WM may vary according to embodiments. Edges of the window member WM may be curved. In other words, the window member WM may have a curved surface.

The base member BS may include a glass substrate, a sapphire substrate, or a plastic substrate. The base member BS may have a single or multi-layer structure. For instance, the base member BS may include a plurality of plastic films coupled to each other by an adhesive. The base member BS may include the glass substrate and the plastic film coupled to the glass substrate by an adhesive member.

The bezel layer BZL may have a single or multi-layer structure. The bezel layer BZL having the multi-layer structure may include a buffer layer for improving an adhesive force, a pattern layer for providing a set or predetermined pattern, and an achromatic layer. The pattern layer may provide a pattern referred to as a hairline pattern. The achromatic layer may include an organic mixture containing a black pigment or dye. The layers may be formed by a depositing, printing, and/or coating method. Although not shown separately, the window member WM may further include a functional coating layer disposed on an entire surface of the base member BS. The functional coating layer may include an anti-fingerprint layer, an anti-reflective layer, and/or a hard coating layer.

The display module DM may include a display panel DP, an input sensing unit ISU, an anti-reflective unit ARU, a protective film PF, and/or a driving control module DCM. FIG. 3 shows the display panel DP in an unbent state, and FIG. 4 shows the display panel DP in a bent state.

The display panel DP is a flexible display panel, for example, an organic light emitting display panel. The display panel DP includes a pixel area PXA (as shown in FIG. 2) in which a pixel PX is located, and a non-pixel area NPXA (as shown in FIG. 2) located adjacent to the pixel area PX when viewed in a plan view. The pixel PX is not in the non-pixel area NPXA, and peripheral components such as signal lines and banks are in the non-pixel area NPXA. The pixel area PX corresponds to the display area DA (e.g., refer to FIG. 1), and the non-pixel area NPXA corresponds to the bezel area BZA (e.g., refer to FIG. 1). However, the areas (for example, shapes or sizes) corresponding to each other may not be completely identical.

The input sensing unit ISU may obtain coordinate information of an external input. The input sensing unit ISU may sense various inputs from outside the electronic device ED. As an example, the input sensing unit ISU may sense inputs from a user's body or various types of external inputs, e.g., light, heat, and/or pressure. In addition, the input sensing unit ISU may sense not only inputs caused by contact between a sensing surface and other objects but also inputs caused by other objects approaching the sensing surface.

The anti-reflective unit ARU may include a polarization film and/or a phase retardation film. The number of the phase retardation films and a phase retardation length ($\lambda/4$ or $\lambda/2$) of the phase retardation film may be determined according to an operation principle of the anti-reflective unit ARU. The anti-reflective unit ARU may include color filters.

Referring to FIGS. 3 and 4, the protective film PF is on a rear surface of the display panel DP. In the present exemplary embodiment, a groove GR is defined in the protective film PF to correspond to a curvature area CA. The groove GR may be formed by a heating block HB (e.g., refer to FIG. 7). The groove GR is defined by removing at least a portion of the protective film PF. Detailed descriptions about processes of forming the groove GR will be described later.

The protective film PF may include the plastic film as its base layer. The protective film PF may include the plastic film containing one selected from the group consisting of a thermoplastic resin, such as polyethyelenetereptha late (PET), polyethyelene (PE), polyvinylchloride (PVC), polypropylene (PP), polystyrene (PS), polyacrylonitrile (PAN), styrene-acrylonitrile copolymer (SAN), acrylonitrile-butadiene-styrene (ABS), polymethyl methacrylate (PMMA), and combinations thereof. In particular, polyethyelenetereptha late (PET) has superior heat resistance, stress strength, and electrical properties, and polyethyelenetereptha late (PET) is less affected by temperature and humidity.

Materials used to form the protective film PF may not be limited to plastic resins and may include organic/inorganic composites. The protective film PF may include a porous organic layer and an inorganic material filled in pores of the organic layer. As an example of the present disclosure, the protective film PF may include a hydrophilic material.

The protective film PF includes a first surface FS facing the rear surface of the display panel DP and a second surface RS opposite to the first surface FS. The second surface RS may be defined as a rear surface of the protective film PF. The display module DM further includes hydrophobic layers HP1 and HP2 on the second surface RS adjacent to the groove GR. The second surface RS of the protective film PF may be divided into a first rear surface RS1 and a second rear surface RS2 such that the groove GR is between the first and second rear surfaces RS1 and RS2. The hydrophobic layers HP1 and HP2 may include a first hydrophobic layer HP1 on the first rear surface RS1 and a second hydrophobic layer HP2 on the second rear surface RS2.

Referring to FIGS. 2-4, the driving control module DCM may include a first circuit board MCB, a second circuit board FCB connecting the first circuit board MCB and the display panel DP, and a driving chip F-IC mounted on the second circuit board FCB. Although not shown separately, a plurality of passive devices and a plurality of active devices may be mounted on the first circuit board MCB. The first circuit board MCB may be a rigid circuit board or a flexible circuit board, and the second circuit board FCB may be a flexible circuit board.

In the present exemplary embodiment, the input sensing unit ISU and the anti-reflective unit ARU are provided separately from the display panel DP, however, at least one of the input sensing unit ISU and the anti-reflective unit ARU may be integrally provided with the display panel DP through continuous processes. At least one of the input sensing unit ISU and the anti-reflective unit ARU may be omitted.

The display module DM further includes first, second, third, fourth, and fifth adhesive members AM1 to AM5. Each of the first to fifth adhesive members AM1 to AM5 may be a pressure sensitive adhesive film (PSA), an optically clear adhesive film (OCA), or an optically clear resin (OCR). Each of the first to fifth adhesive members AM1 to AM5 may include a light-curable adhesive material or a heat-curable adhesive material, however, they may not be limited to a specific material. In addition, some of the first to fifth adhesive members AM1 to AM5 may be omitted.

As an example of the present disclosure, the input sensing unit ISU is on a rear surface of the window member WM. The first adhesive member AM1 is located between the window member WM and the input sensing unit ISU, and the window member WM and the input sensing unit ISU may be coupled to each other by the first adhesive member AM1.

The anti-reflective unit ARU is on a rear surface of the input sensing unit ISU. The second adhesive member AM2 is located between the input sensing unit ISU and the anti-reflective unit ARU, and the input sensing unit ISU and the anti-reflective unit ARU may be coupled to each other by the second adhesive member AM2.

The display panel DP is on a rear surface of the anti-reflective unit ARU. The third adhesive member AM3 is located between the anti-reflective unit ARU and the display panel DP, and the anti-reflective unit ARU and the display panel DP may be coupled to each other by the third adhesive member AM3. As an example of the present disclosure, the third adhesive member AM3 may be relatively thinner (i.e., has relatively less thickness) than that of the first adhesive member AM1 and the second adhesive member AM2. As another example of the present disclosure, positions of the anti-reflective unit ARU and the input sensing unit ISU may be changed with respect to each other.

In FIGS. 3 and 4, for the convenience of explanation, the display panel DP is shown as a single layer, however, the display panel DP in the discussed embodiment includes plural layers.

Figure 5:
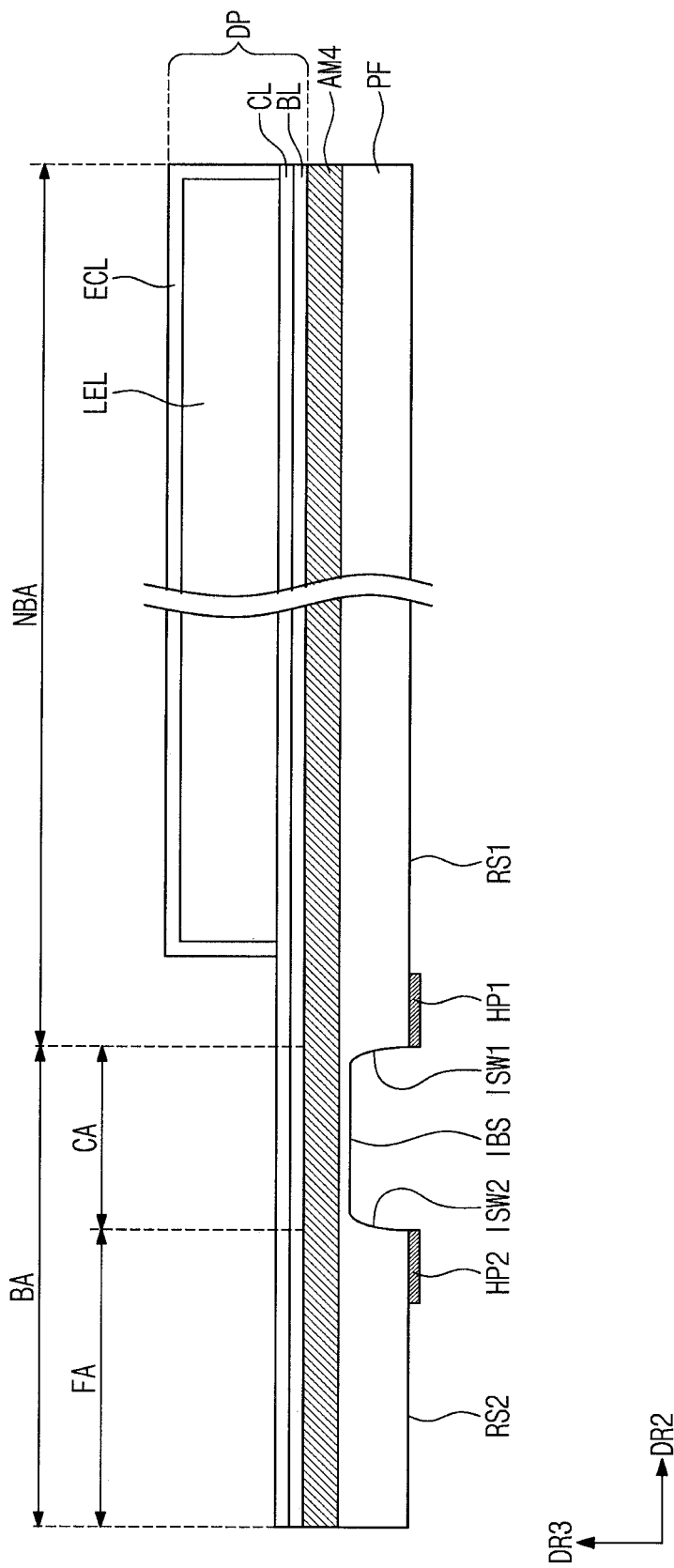
FIG. 5 is a partially enlarged cross-sectional view of a display module shown in FIG. 3, according to an exemplary embodiment of the present disclosure.
Figure 6:
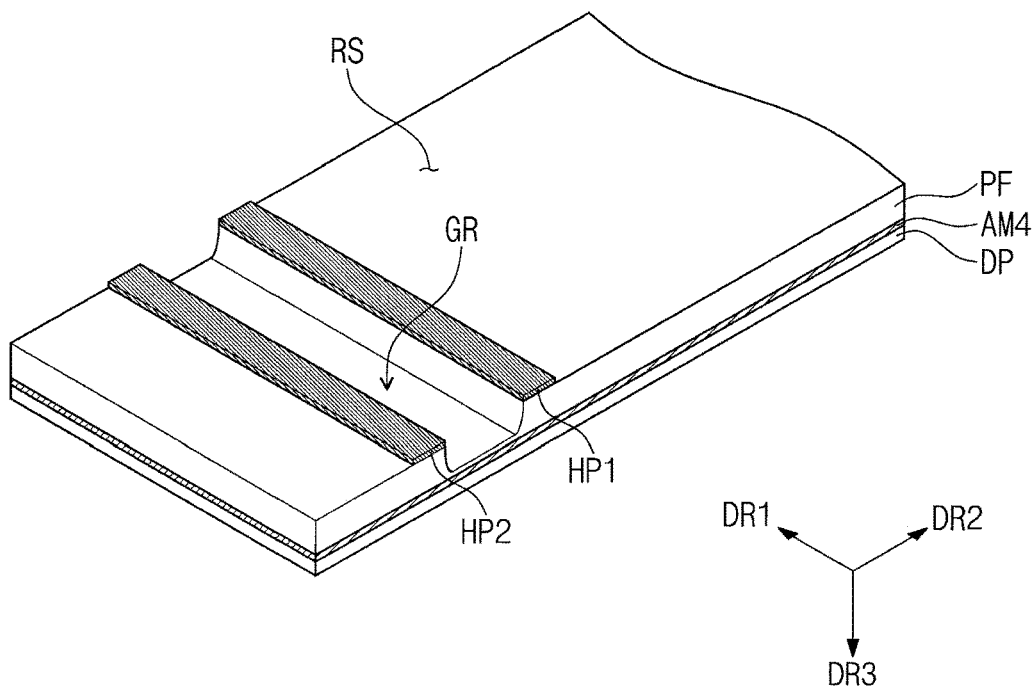
FIG. 6 is a rear view of the display module shown in FIG. 5, according to an exemplary embodiment of the present disclosure.

FIG. 5 is a partially enlarged cross-sectional view of the display module shown in FIG. 3, according to an exemplary embodiment of the present disclosure, and FIG. 6 is a rear view the display module shown in FIG. 5, according to an exemplary embodiment of the present disclosure.

Referring to FIGS. 2-5, the display panel DP includes a base layer BL, a circuit layer CL, an element layer LEL, and an encapsulation layer ECL.

The base layer BL may be a resin layer containing polyimide (PI), however, the base layer BL may not be limited to a particular material. The circuit layer CL is on an entire surface of the base layer BL. The circuit layer CL has a multi-layer structure of an insulating layer, a conductive layer, and a semiconductor layer. The circuit layer CL includes a pixel circuit with a thin film transistor and signal lines connected to the pixel circuit.

The element layer LEL is on an entire surface of the circuit layer CL. The element layer LEL may include a light emitting element, for example, an organic light emitting element. The encapsulation layer ECL is on the element layer LEL to encapsulate the element layer LEL. The encapsulation layer ECL may have a double-layer structure of an organic layer/inorganic layer, which is called a thin film encapsulation (TFE). As another example, the encapsulation layer ECL may include only the inorganic layer or only the organic layer. The display panel DP may include an encapsulation substrate and a sealant instead of the encapsulation layer ECL. The sealant may adhere the encapsulation substrate to the element layer LEL.

The display panel DP and the protective film PF may be coupled to each other by the fourth adhesive member AM4. Particularly, a rear surface of the base layer BL and the protective film PF may be coupled to each other by the fourth adhesive member AM4.

The display panel DP may include two areas. That is, the display panel DP may be divided into a bending area BA and a non-bending area NBA. The bending area BA may include the curvature area CA having the set or predetermined curvature in the bent state and a facing area FA facing the non-bending area NBA in the bent state.

The base layer BL and the circuit layer CL may be located corresponding to the non-bending area NBA and the bending area BA. The element layer LEL and the encapsulation layer ECL may be in the non-bending area NBA.

Referring to FIGS. 5 and 6, the groove GR has a shape recessed from the second surface RS of the protective film PF and is formed extending in the first direction DR1.

The protective film PF is located adjacent to the groove GR and further includes a first inner sidewall ISW1, a second inner sidewall ISW2, and a bottom surface IBS, which define the groove GR. The first and second hydrophobic layers HP1 and HP2 are respectively located on the first and second rear surfaces RS1 and RS2 to be respectively adjacent to the first and second inner sidewalls ISW1 and ISW2. The first and second hydrophobic layers HP1 and HP2 extend in the first direction DR1 to be parallel to the groove GR.

Each of the first and second hydrophobic layers HP1 and HP2 may include a hydrophobic material with a water contact angle from about 90 degrees to about 150 degrees or a highly hydrophobic material with the water contact angle equal to or greater than about 150 degrees. In detail, each of the first and second hydrophobic layers HP1 and HP2 may include a material with a hydrophobic property, such as manganese oxide (MnO2) polystyrene, zinc oxide (ZnO) polystyrene, precipitated calcium carbonate, carbon nanotube, silica, or fluoropolymer.

Referring to FIGS. 3 and 4, the curvature area CA is between the facing area FA and the non-bending area NBA in the unbent state, and the facing area FA faces the non-bending area NBA in the thickness direction DR3 of the display module DM in the bent state. In the bent state, a set or predetermined radius of curvature is defined in the bending area BA with respect to a bending axis BX extending in the first direction DR1.

Pads of the circuit layer CL (e.g., refer to FIG. 5) may be aligned at one side portion of the facing area FA. The second circuit board FCB is connected to the facing area FA. The first circuit board MCB and the second circuit board FCB face the rear surface of the display panel DP in the bent state.

Because, the groove GR is defined in the curvature area CA of the protective film PF, a stress occurring in the circuit layer CL during the bent state may be reduced.

In the exemplary embodiment of the present disclosure, the protective film PF remains in the area in which the groove GR is defined, however, the present disclosure may not be limited thereto or thereby. That is, as another embodiment, the protective film PF may be removed from the area in which the groove GR is defined such that the fourth adhesive member AM4 is exposed to the outside, or the protective film PF and the fourth adhesive member AM4 are removed from the area in which the groove GR is defined such that a portion of the rear surface of the display panel DP corresponding to the curvature area CA is exposed to the outside. In this case, the term "outside" is defined with respect to the display module DM in an inner space of the electronic device ED rather than the outside of the electronic device ED.

The first circuit board MCB and the second circuit board FCB may be coupled to each other by the fifth adhesive member AM5 located between the first circuit board MCB and the second circuit board FCB in the third direction DR3. The fifth adhesive member AM5 may include a conductive material to electrically connect the first circuit board MCB and the second circuit board FCB. However, in other embodiments, the fifth adhesive member AM5 may merely physically connect the first and second circuit boards MCB and FCB, and the first and second circuit boards MCB and FCB may be electrically connected to each other by an additional conductive member (not shown) provided separately from the fifth adhesive member AM5.

Figure 7:
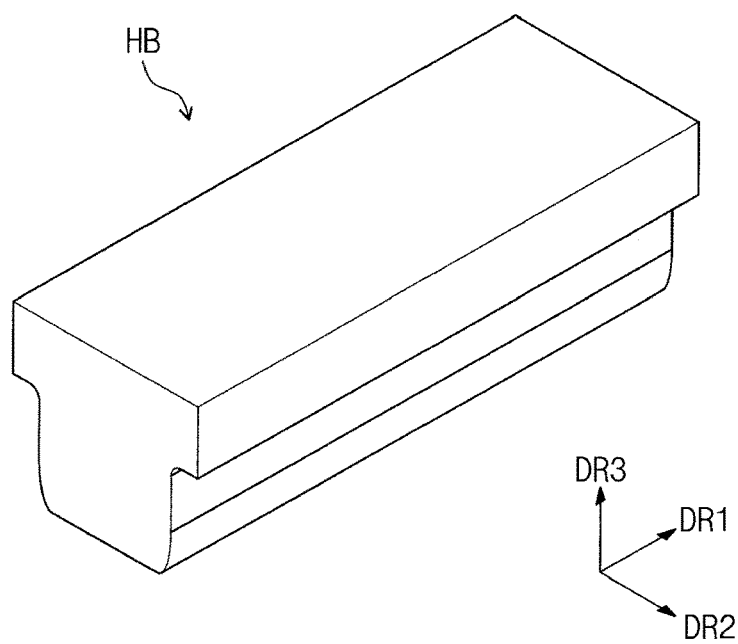
FIG. 7 is a perspective view showing a heating block, according to an exemplary embodiment of the present disclosure.

FIG. 7 is a perspective view showing a heating block, according to an exemplary embodiment of the present disclosure, and FIGS. 8A to 8D are side views showing a method of manufacturing a display device, according to an exemplary embodiment of the present disclosure.

The heating block HB shown in FIG. 7 includes a metal column having a bar shape. The heating block HB may include stainless steel with superior strength and durability or may include aluminum or copper with a high thermal conductivity. A length in the direction DR1 in which the heating block HB extends may be longer or shorter than a length in the first direction DR1 of the display device DD (e.g., refer to FIG. 2).

Figure 8A:
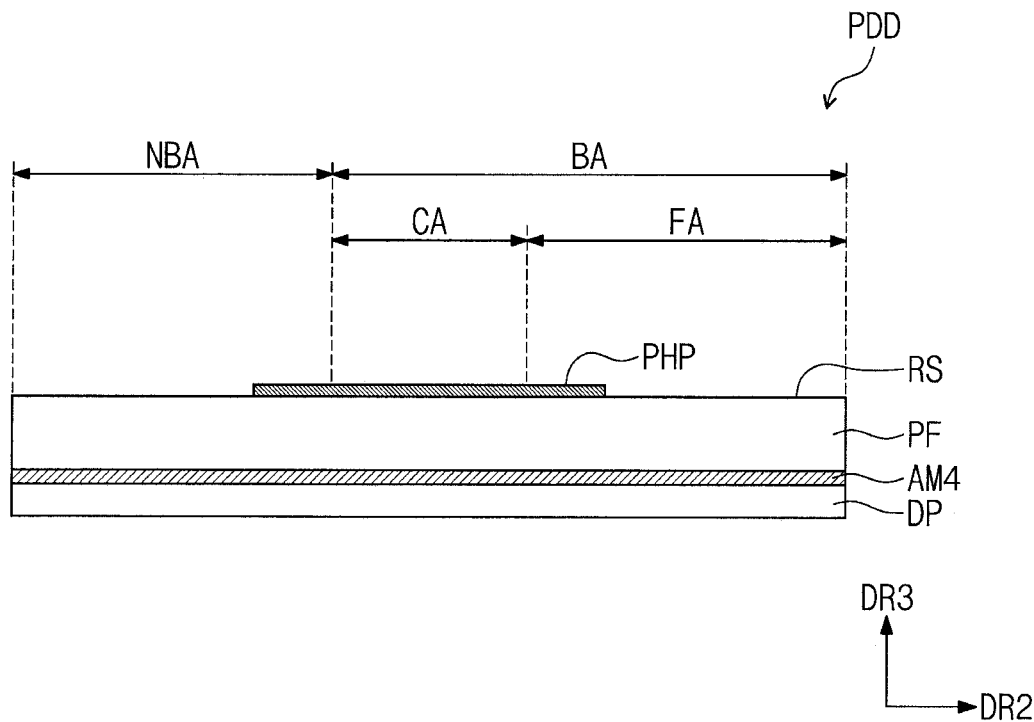
FIGS. 8A to 8D are side views showing a method of manufacturing a display device, according to an exemplary embodiment of the present disclosure.

As shown in FIG. 8A, a preliminary display device PDD including the bending area BA and the non-bending area NBA is provided. The preliminary display device PDD is in a state in which the groove GR (e.g., refer to FIGS. 2 and 3) is not formed in the protective film PF. A preliminary hydrophobic layer PHP is formed on the rear surface RS of the protective film PF. In detail, the preliminary hydrophobic layer PHP may be formed to cover the curvature area CA. A width in the second direction DR2 of the preliminary hydrophobic layer PHP is greater than a width in the second direction DR2 of the curvature area CA.

As an example of the present disclosure, the preliminary hydrophobic layer PHP may include the hydrophobic material with the water contact angle from about 90 degrees to about 150 degrees or the highly hydrophobic material with the water contact angle equal to or greater than about 150 degrees. In detail, the preliminary hydrophobic layer PHP may include a material with a hydrophobic property, such as manganese oxide (MnO2) polystyrene, zinc oxide (ZnO) polystyrene, precipitated calcium carbonate, carbon nanotube, silica, or fluoropolymer.

The preliminary hydrophobic layer PHP may be coated on the rear surface RS of the protective film PF with a thickness equal to or less than about 10 micrometers (μm). The thickness of the preliminary hydrophobic layer PHP may not be limited to the above value, and the thickness may vary depending on a process condition or a material of the preliminary hydrophobic layer PHP. In detail, the process condition may include a heating temperature of the heating block HB, a contact time of the heating block HB, and an applied pressure of the heating block HB.

Figure 8B:
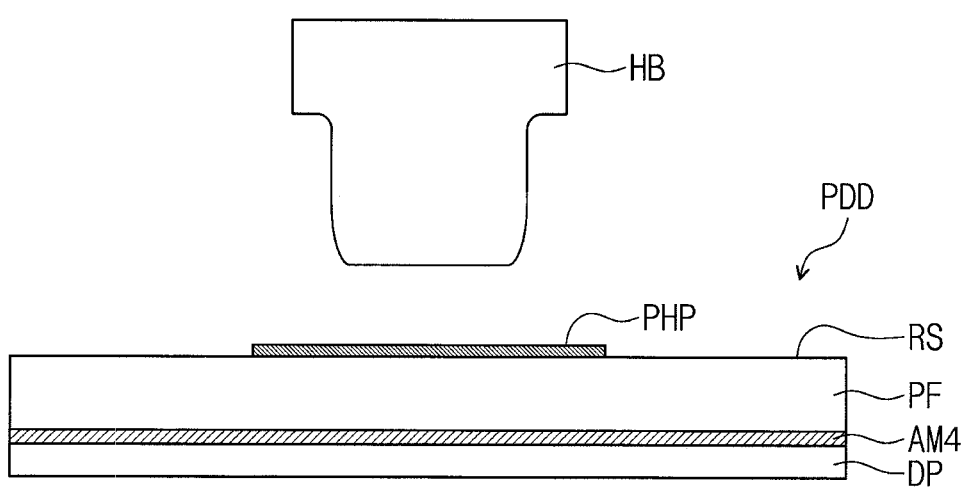

As shown in FIG. 8B, the heating block HB is aligned with the preliminary display device PDD. The heating block HB may be disposed above the preliminary hydrophobic layer PHP. The heating block HB is heated at a set or predetermined temperature after being aligned with the preliminary display device PDD.

Figure 8C:
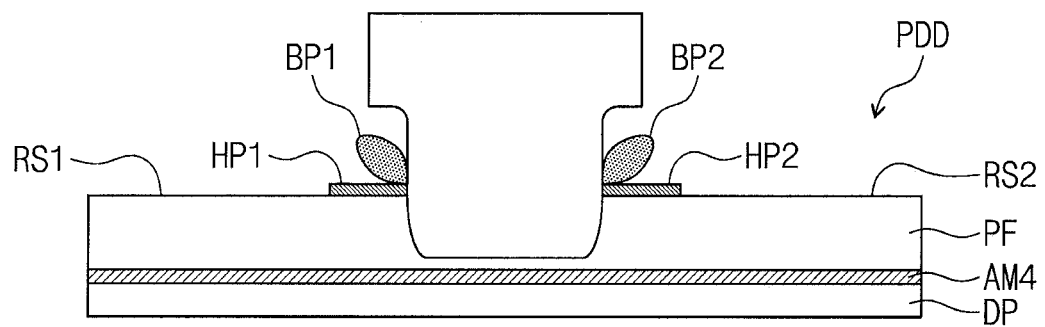

As shown in FIG. 8C, the heating block HB presses the protective film PF to remove portions of the preliminary hydrophobic layer PHP and the protective film PF. The heating block HB may press the protective film PF in a state in which the heating block HB is heated at a temperature higher than a sublimation temperature of the protective film PF. For instance, in a case where a PET film is applied to the protective film PF, the heating block HB may be heated at the temperature higher than about 250° C.

A maximum heating temperature of the heating block HB may be set by taking into account the base layer BL of the display panel DP. The heating temperature of the heating block HB may be set to a temperature at which the protective film PF is sublimated but no thermal damage occurs to the base layer BL. In a case where the base layer BL includes polyimide, the maximum heating temperature of the heating block HB may be lower than about 600° C.

The rear surface RS of the protective film PF is divided into the first and second rear surfaces RS1 and RS2 by the groove GR. The first hydrophobic layer HP1 is formed on the first rear surface RS1 to be adjacent to the groove GR, and the second hydrophobic layer HP2 is formed on the second rear surface RS2 to be adjacent to the groove GR. A first bump BP1 is formed on the first hydrophobic layer HP1, and a second bump BP2 is formed on the second hydrophobic layer HP2. That is, the first bump BP1 and the second bump BP2 are formed by a plastic resin accumulated on the first and second hydrophobic layers HP1 and HP2 during the sublimation of the protective film PF.

Figure 8D:
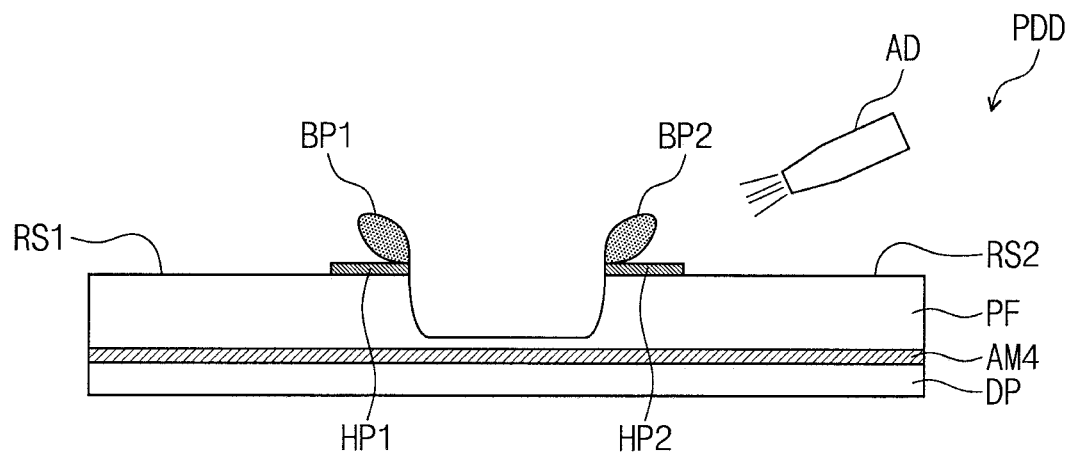

FIG. 8D shows the display device DD from which the heating block HB is removed. After removing the heating block HB, a process of removing the first and second bumps BP1 and BP2 formed on the first and second hydrophobic layers HP1 and HP2 is performed. Because, the first and second bumps BP1 and BP2 are formed while the protective film PF is sublimated, the first and second bumps BP1 and BP2 include a hydrophilic material as the protective film PF. Accordingly, when the first and second bumps BP1 and BP2 are respectively accumulated on the first and second hydrophobic layers HP1 and HP2, an interface is formed between the first bump BP1 and the first hydrophobic layer HP1 and between the second bump BP2 and the second hydrophobic layer HP2. An area between the first bump BP1 and the first hydrophobic layer HP1 may vary depending on the water contact angle of the first and second hydrophobic layers HP1 and HP2. For example, in the case that the first and second hydrophobic layers HP1 and HP2 include the highly hydrophobic material with the water contact angle equal to or greater than about 150 degrees, the area of the interface is reduced compared to that when the first and second hydrophobic layers HP1 and HP2 include the hydrophobic material with the water contact angle smaller than about 150 degrees.

As described above, when the area of the interface is reduced, the first and second bumps BP1 and BP2 may be easily removed from the first and second hydrophobic layers HP1 and HP2 using a physical force such as air. As an example of the present disclosure, the first and second bumps BP1 and BP2 are removed by using an air spray device AD in FIG. 8D, but it may not be limited thereto or thereby. When the area of the interface is reduced, an adhesive force between the first bump BP1 and the first hydrophobic layer HP1 and between the second bump BP2 and the second hydrophobic layer HP2 decreases, and thus the first and second bumps BP1 and BP2 may be easily removed from the first and second hydrophobic layers HP1 and HP2 with a small force, respectively.

As shown in FIG. 8D, inner side surfaces of the fourth adhesive member AM4 defining the groove GR may be covered by the protective film PF. Accordingly, the inner side surfaces of the fourth adhesive member AM4 may not be exposed to the outside.

Referring to FIG. 4 again, a portion (i.e., the curvature area CA) of the display device DD corresponding to the groove GR is bent at a set or predetermined curvature. The first hydrophobic layer HP1 may face the second hydrophobic layer HP2.

Although not shown in the figures, as an example of the present disclosure, a heat discharge sheet and/or an anti-static sheet may be further disposed between the first and second hydrophobic layers HP1 and HP2 in the bent display device DD. In addition, as another example, the heat discharge sheet and/or the anti-static sheet may be spaced apart from the first and second hydrophobic layers HP1 and HP2 in the second direction DR2 and disposed between the first rear surface RS1 and the second rear surface RS2 of the protective film PF.

Figure 9:
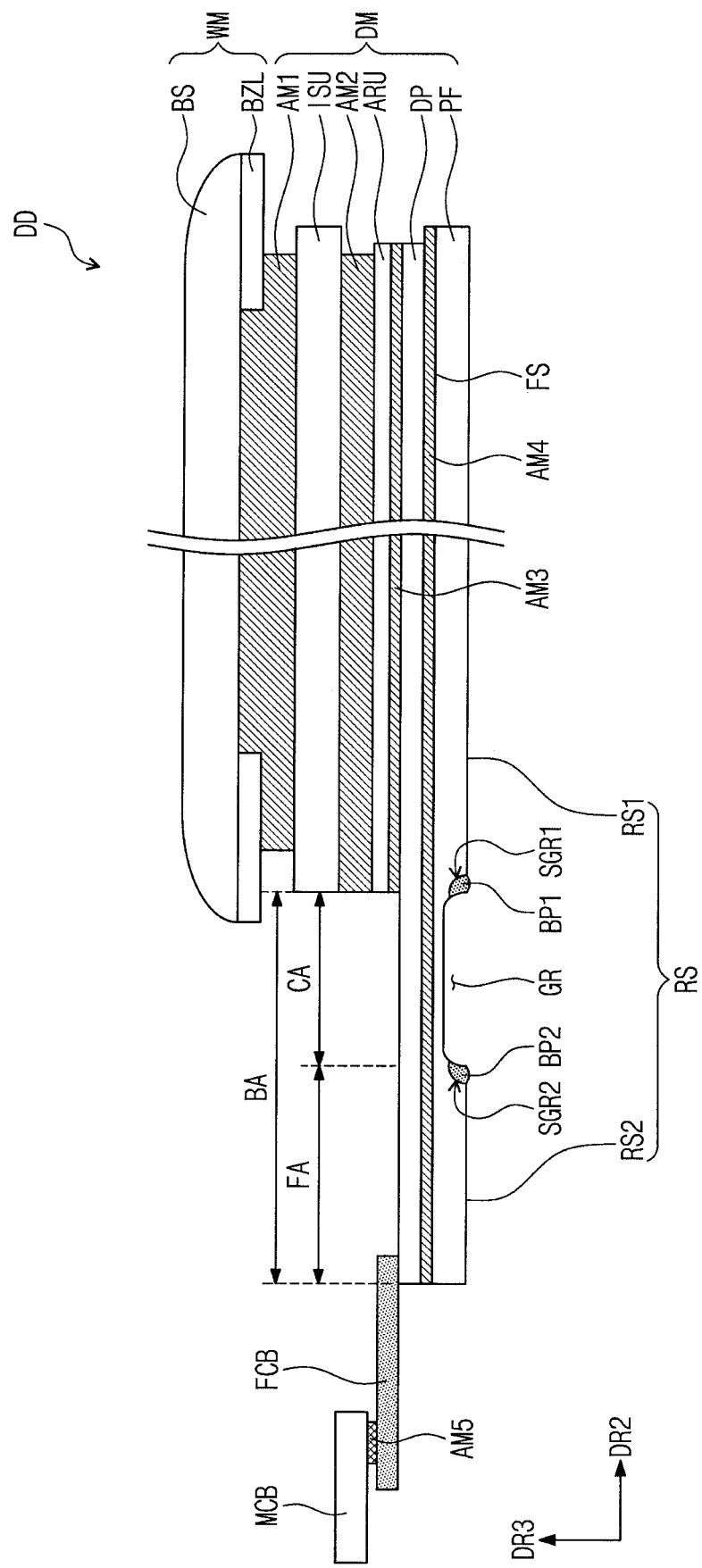
FIG. 9 is a side view showing a display device, according to another exemplary embodiment of the present disclosure.
Figure 10:
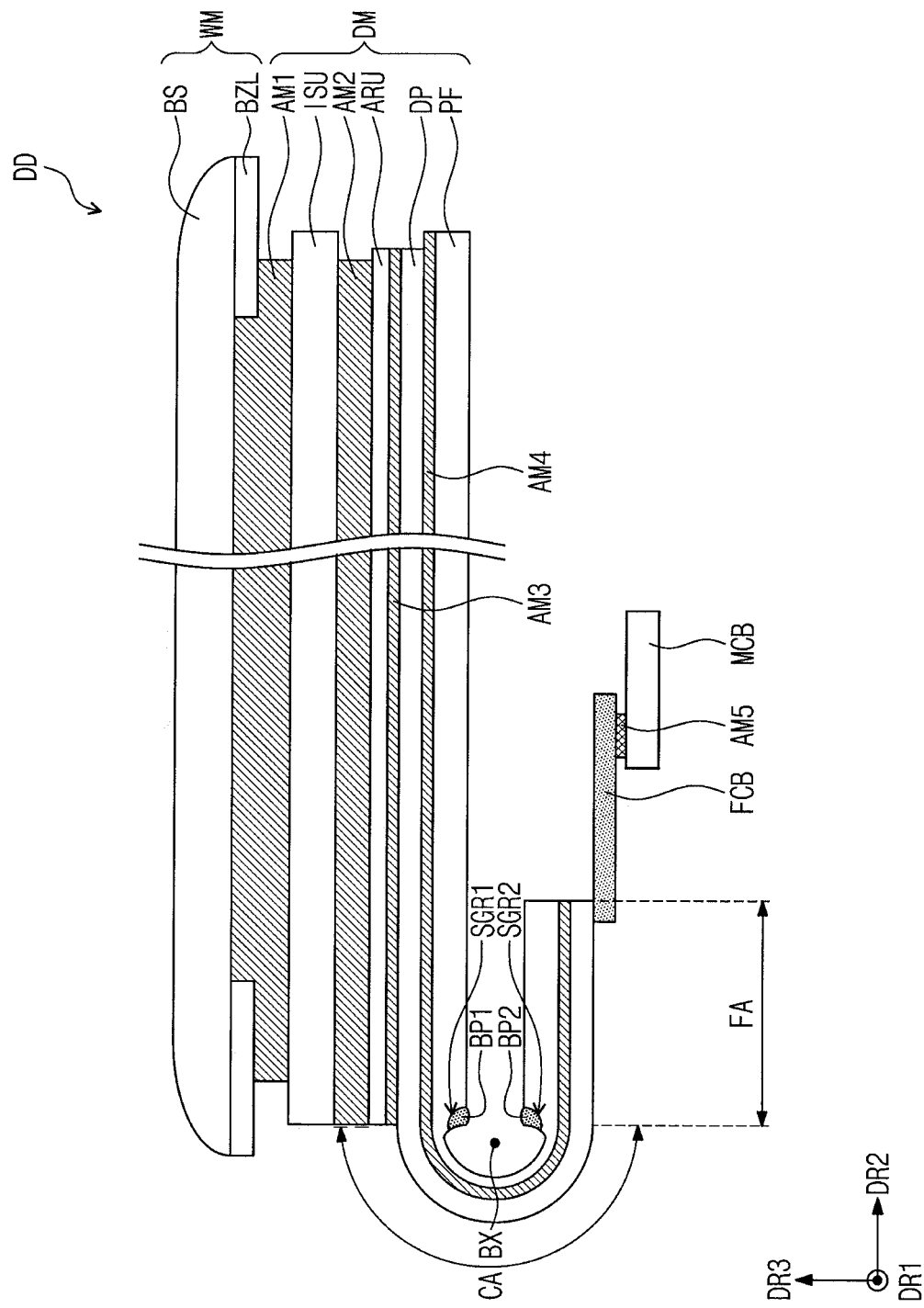
FIG. 10 is a side view showing a bent state of the display device shown in FIG. 9, according to an exemplary embodiment of the present disclosure.

FIG. 9 is a side view showing a display device DD, according to another exemplary embodiment of the present disclosure, and FIG. 10 is a side view showing a bent state of the display device DD shown in FIG. 9, according to an exemplary embodiment of the present disclosure.

Referring to FIGS. 9 and 10, the protective film PF is on the rear surface of the display panel DP in the display device DD, according to another exemplary embodiment of the present disclosure. In the present exemplary embodiment, a groove GR is defined in the protective film PF corresponding to the curvature area CA. The groove GR corresponds to an area defined by removing at least a portion of the protective film PF.

The protective film PF includes a first surface FS facing the rear surface of the display panel DP and a second surface RS opposite to the first surface FS. The second surface RS of the protective film PF is divided into a first rear surface RS1 and a second rear surface RS2 by the groove GR.

The protective film PF includes a bottom surface IBS (e.g., as shown in FIG. 5), a first inner sidewall ISW1 (e.g., as shown in FIG. 5), and a second inner sidewall ISW2 (e.g., as shown in FIG. 5) to define the groove GR. The first inner sidewall ISW1 extends from one end of the bottom surface IBS, and the second inner sidewall ISW2 extends from the other end of the bottom surface IBS. A first sub-groove SGR1 is formed between the first inner sidewall ISW1 and the first rear surface RS1, and a second sub-groove SGR2 is formed between the second inner sidewall ISW2 and the second rear surface RS2. In detail, the groove GR is located between the first and second sub-grooves SGR1 and SGR2.

A first bump BP1 is formed in the first sub-groove SGR1, and a second bump BP2 is formed in the second sub-groove SGR2. According to the exemplary embodiment of the present disclosure, the first and second bumps BP1 and BP2 are respectively accommodated in the first and second sub-grooves SGR1 and SGR2. Accordingly, a height of the first and second bumps BP1 and BP2 protruded from a horizontal surface parallel to the second surface RS of the protective film PF may be reduced compared with that when the first and second sub-grooves SGR1 and SGR2 are not formed.

Referring to FIG. 10, the portion of the display device DD corresponding to the groove GR is bent to have the set or predetermined curvature. In this case, the first sub-groove SGR1 may face the second sub-groove SGR2, and the first bump BP1 may face the second bump BP2.

As described above, because the protruded heights of the first and second bumps BP1 and BP2 are reduced, interference due to the first and second bumps BP1 and BP2 may be reduced even though the first and second bumps BP1 and BP2 face each other in the bent state of the display device DD.

Although not shown in figures, as an example of the present disclosure, a heat discharge sheet and/or an anti-static sheet may be further disposed between the first and second bumps BP1 and BP2 in the bent display device DD. In addition, as another example, the heat discharge sheet and/or the anti-static sheet may be spaced apart from the first and second bumps BP1 and BP2 in the second direction DR2 and disposed between the first rear surface RS1 and the second rear surface RS2 of the protective film PF.

Figure 11A:
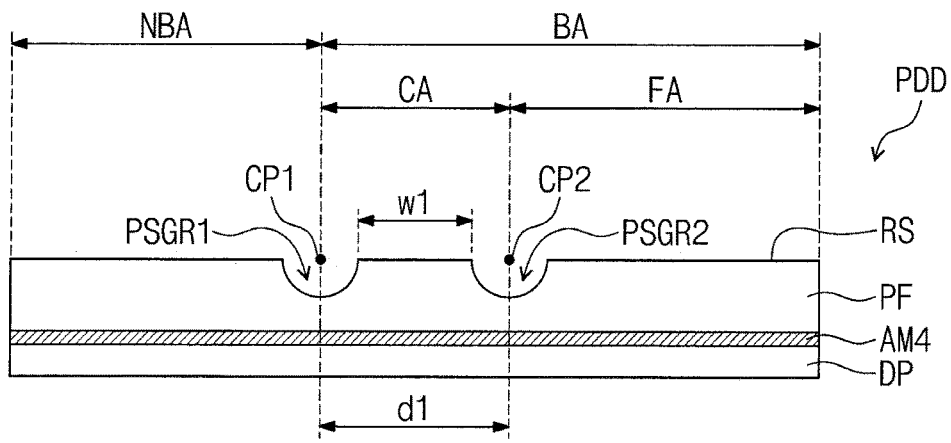
FIGS. 11A to 11C are cross-sectional views showing a method of manufacturing the display device shown in FIG. 9, according to an exemplary embodiment of the present disclosure.
Figure 11B:
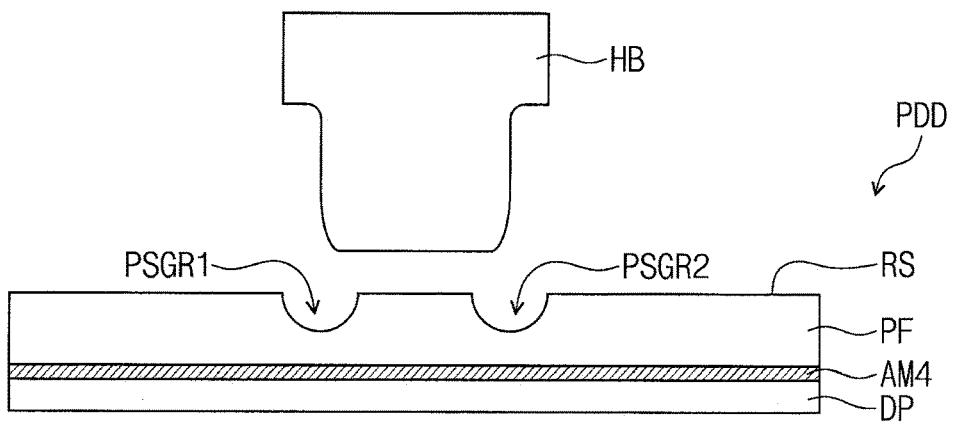
Figure 11C:
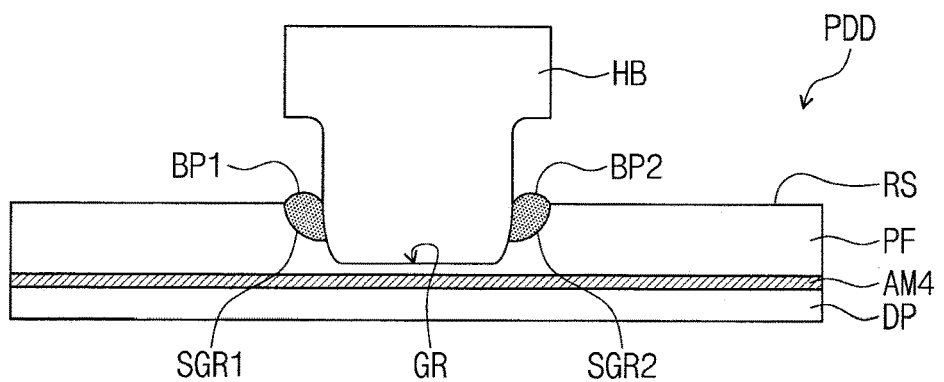
Figure 12A:
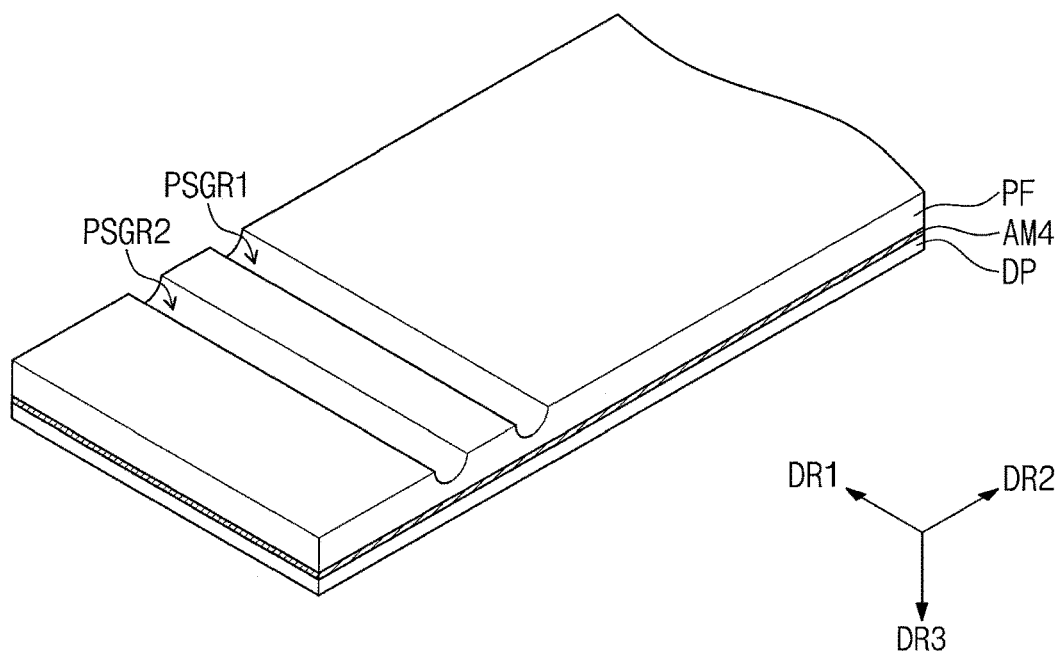
FIG. 12A is a perspective view of FIG. 11A, according to an exemplary embodiment of the present disclosure.
Figure 12B:
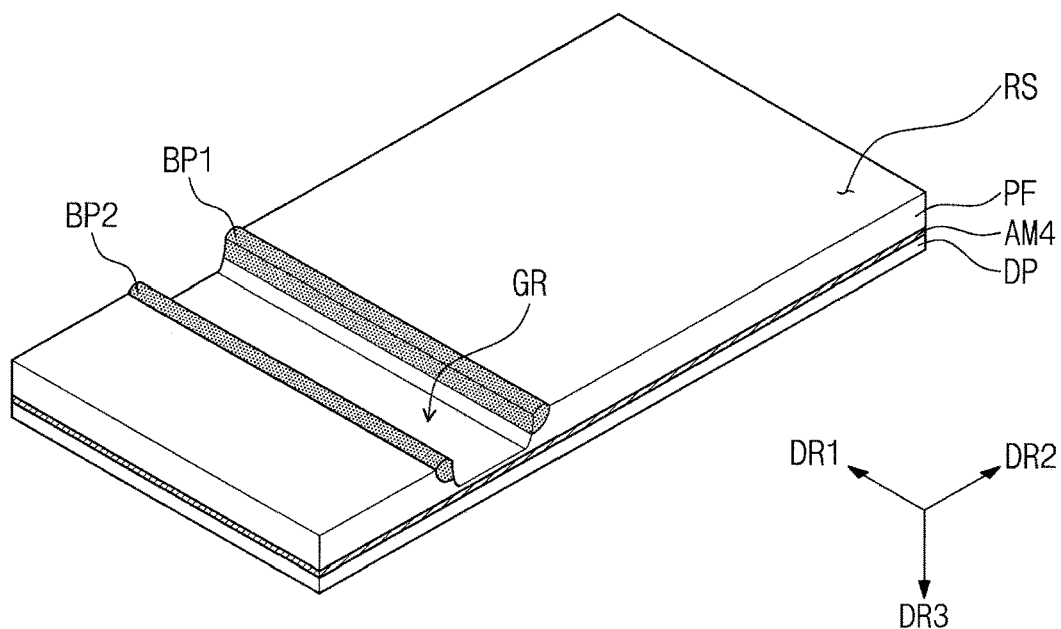
FIG. 12B is a perspective view of FIG. 11C, according to an exemplary embodiment of the present disclosure.

FIGS. 11A-11C are cross-sectional views showing a method of manufacturing the display device shown in FIG. 9, according to an exemplary embodiment of the present disclosure, FIG. 12A is a perspective view of FIG. 11A, according to an exemplary embodiment of the present disclosure, and FIG. 12B is a perspective view of FIG. 11C, according to an exemplary embodiment of the present disclosure.

Referring to FIGS. 11A and 12A, a preliminary display device PDD including a bending area BA and a non-bending area NBA is provided. The preliminary display device PDD is in a state in which the groove GR (e.g., refer to FIGS. 9 and 10) is not formed in the protective film PF. First and second preliminary sub-grooves PSGR1 and PSGR2 are formed in the second surface RS of the protective film PF. In detail, the first and second preliminary sub-grooves PSGR1 and PSGR2 may be formed to overlap with the curvature area CA.

As an example of the present disclosure, a distance d1 between a center portion (hereinafter, referred to as "first center portion CP1") of the first preliminary sub-groove PSGR1 and a center portion (hereinafter, referred to as "second center portion CP2") of the second preliminary sub-groove PSGR2 is equal to a width of the curvature area CA. However, according to embodiments, positions of the first and second preliminary sub-grooves PSGR1 and PSGR2 may be set under a condition in which a width w1 of the second surface RS between the first and second preliminary sub-grooves PSGR1 and PSGR2 is not greater than the width of the curvature area CA and the distance d1 between the first center portion CP1 and the second center portion CP2 is not smaller than the width of the curvature area CA.

The first and second preliminary sub-grooves PSGR1 and PSGR2 may be formed through, for example, a blanking process, but it may not be limited thereto or thereby.

The first and second preliminary sub-grooves PSGR1 and PSGR2 have a shape formed by recessing a portion of the protective film PF from the second surface RS and extend in the first direction DR1.

Although not shown in the figures, as another exemplary embodiment, the first and second preliminary sub-grooves PSGR1 and PSGR2 may be formed in a dot form. In addition, a plurality of first preliminary sub-grooves PSGR1 spaced apart from each other in the second direction DR2 and a plurality of second preliminary sub-grooves PSGR2 spaced apart from each other in the second direction DR2 may be formed on first and second rear surfaces RS1 and RS2 of the protective film PF, respectively.

Referring to FIG. 11B, the heating block HB is aligned with the preliminary display device PDD. The heating block HB may be disposed above the preliminary hydrophobic layer PHP. The heating block HB is heated at a set or predetermined temperature after being aligned.

As shown in FIG. 11C, the heating block HB presses the protective film PF to remove portions of the preliminary hydrophobic layer PHP and the protective film PF. The heating block HB may press the protective film PF in a state in which the heating block HB is heated at a temperature higher than a sublimation temperature of the protective film PF. For instance, in a case where a PET film is applied to the protective film PF, the heating block HB may be heated at the temperature higher than about 250° C.

A maximum heating temperature of the heating block HB may be set by taking into account the base layer BL of the display panel DP. The heating temperature of the heating block HB may be set to a temperature at which the protective film PF is sublimated but no thermal damage occurs to the base layer BL. In a case where the base layer BL includes polyimide, the maximum heating temperature may be lower than about 600° C.

A portion of the protective film PF between the first and second preliminary sub-grooves PSGR1 and PSGR2 is sublimated, and thus the groove GR is formed between the first and second preliminary sub-grooves PSGR1 and PSGR2. According to the positions of the first and second preliminary sub-grooves PSGR1 and PSGR2, the first and second sub-grooves SGR1 and SGR2 may be formed in the same shape as the first and second preliminary sub-grooves PSGR1 and PSGR2, or portions of the first and second preliminary sub-grooves PSGR1 and PSGR2 may be formed as the first and second sub-grooves SGR1 and SGR2.

A portion of the protective film PF, which is melted during the sublimation of the protective film PF, may be collected in the first and second sub-grooves SGR1 and SGR2. Accordingly, the melted portion of the protective film PF moves to the first sub-groove SGR1 to form the first bump BP1 and moves to the second sub-groove SGR2 to form the second bump BP2.

In this case, a crystal structure of the first and second bumps BP1 and BP2 is different from a crystal structure of the protective film PF. The crystal structure of the first and second bumps BP1 and BP2 may be denser than the crystal structure of the protective film PF. For example, the first and second bumps BP1 and BP2 may have a face-centered cubic crystal structure, and the protective film PF may have a body-centered cubic crystal structure.

As shown in FIG. 12B, the first and second bumps BP1 and BP2 extend in the first direction DR1 along the first and second sub-grooves SGR1 and SGR2.

Although the exemplary embodiments of the present invention have been described, it is understood that the present invention may not be limited to these exemplary embodiments but various changes and modifications can be made by one ordinary skilled in the art within the spirit and scope of the present invention as hereinafter claimed.

Therefore, the disclosed subject matter may not be limited to any single embodiment described herein, and the scope of the present inventive concept shall be determined according to the attached claims.

What is claimed is:
1. A method of manufacturing a display device, the method comprising:
    providing a preliminary display device comprising a display panel comprising a first area and a second area connected to the first area, an adhesive member on a rear surface of the display panel, and a protective film comprising a first surface on which a rear surface of the adhesive member is located;
    forming first and second sub-grooves in a second surface of the protective film, which is opposite to the first surface of the protective film, to overlap with the second area;
    pressing the protective film using a heating block such that a portion of the protective film corresponding to a portion between the first and second sub-grooves is removed to form a groove, the removed portion of the protective film, which is collected in the first and second sub-grooves being formed as first and second bumps; and
    bending the second area.

2. The method of claim 1, wherein the second surface of the protective film comprises a first rear surface and a second rear surface, wherein the groove is between the first and second rear surfaces, and the protective film further comprises a first inner side surface extending from the first rear surface to define the groove and a second inner side surface extending from the second rear surface to define the groove.

3. The method of claim 2, wherein the first sub-groove is formed between the first rear surface and the first inner side surface, and the second sub-groove is formed between the second rear surface and the second inner side surface.

4. The method of claim 1, wherein the groove extends in a first direction, and each of the first and second sub-grooves extends in the first direction along the groove.

5. The method of claim 1, wherein the first and second sub-grooves are formed in the second surface through a blanking process.

6. The method of claim 1, wherein the first bump and the second bump face each other when the second area is bent.

7. The method of claim 1, wherein the protective film comprises a thermoplastic resin, and the heating block is heated at a temperature higher than a sublimation temperature of the thermoplastic resin.

* * * * *